US012796487B2

(12) United States Patent
Magni

(10) Patent No.: US 12,796,487 B2
(45) Date of Patent: Nov. 10, 2026

(54) METHOD OF MANUFACTURING LEADFRAMES FOR SEMICONDUCTOR DEVICES, CORRESPONDING LEADFRAME AND SEMICONDUCTOR DEVICE

(71) Applicant: STMICROELECTRONICS S.R.L., Agrate Brianza (IT)

(72) Inventor: Pierangelo Magni, Villasanta (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 1107 days.

(21) Appl. No.: 17/823,650

(22) Filed: Aug. 31, 2022

(65) Prior Publication Data

US 2022/0406703 A1 Dec. 22, 2022

Related U.S. Application Data

(62) Division of application No. 16/837,565, filed on Apr. 1, 2020, now Pat. No. 11,462,465.

(30) Foreign Application Priority Data

Apr. 5, 2019 (IT) ........................ 102019000005156

(51) Int. Cl.
*H10W 70/40* (2026.01)
*H10W 70/04* (2026.01)

(52) U.S. Cl.
CPC ....... *H10W 70/479* (2026.01); *H10W 70/047* (2026.01); *H10W 70/048* (2026.01)

(58) Field of Classification Search
CPC ......................... H10W 70/479; H10W 70/048; H10W 70/047

(Continued)

(56) References Cited

U.S. PATENT DOCUMENTS 4,797,530 A * 1/1989 Iwase .................... C04B 41/009 219/121.85
8,536,715 B2 9/2013 Chino
(Continued)

FOREIGN PATENT DOCUMENTS

CN 102097408 A 6/2011
CN 107086212 A 8/2017
(Continued)

*Primary Examiner* — Bo B Jang
(74) *Attorney, Agent, or Firm* — Seed Intellectual Property Law Group LLP

(57) ABSTRACT

Leadframes for semiconductor devices are manufactured by providing a laminar substrate of laser direct structuring material, the laminar substrate comprising first and second opposed surfaces, applying laser beam processing to the substrate to provide a first pattern of electrically-conductive formations at the first surface, a second pattern of electrically-conductive formations at the second surface and electrically-conductive vias through the substrate between the first surface and the second surface. Electrically-conductive material is formed, for instance via electrolytic or electroless growth of electrically-conductive material such a copper onto the first and second pattern of electrically-conductive formations as well as onto the electrically-conductive vias provided by applying laser beam processing to the substrate. The electrically-conductive vias are coupled to one or both of the electrically-conductive formations in the first pattern of electrically-conductive formations and the second pattern of electrically-conductive formations.

20 Claims, 5 Drawing Sheets

(58) Field of Classification Search
USPC .......................................................... 257/133
See application file for complete search history.

(56) References Cited

U.S. PATENT DOCUMENTS

| | | | |
|---|---|---|---|
| 8,581,421 | B2 | 11/2013 | Shimizu et al. |
| 8,686,300 | B2 | 4/2014 | Kawai et al. |
| 9,171,739 | B1 | 10/2015 | Roh et al. |
| 2007/0144769 | A1 | 6/2007 | Salama |
| 2009/0263639 | A1 | 10/2009 | Dunbar et al. |
| 2012/0319304 | A1 | 12/2012 | Pressel et al. |
| 2017/0256479 | A1 | 9/2017 | Liu et al. |
| 2018/0342453 | A1 | 11/2018 | Ziglioli |
| 2019/0006191 | A1 | 1/2019 | Marchisi |

FOREIGN PATENT DOCUMENTS

| | | | |
|---|---|---|---|
| CN | 107579054 | A | 1/2018 |
| EP | 0227371 | A1 | 7/1987 |

* cited by examiner

METHOD OF MANUFACTURING LEADFRAMES FOR SEMICONDUCTOR DEVICES, CORRESPONDING LEADFRAME AND SEMICONDUCTOR DEVICE

BACKGROUND

Technical Field

The description relates to manufacturing semiconductor devices.

One or more embodiments may be applied to manufacturing leadframes for semiconductor devices such as integrated circuits (ICs), for instance.

Description of the Related Art

Various technologies are currently available for manufacturing leadframes/substrates for various types of semiconductor devices such as QFN (Quad Flat No-lead), LGA (Land Grid Array), BGA (Ball Grid Array) semiconductor devices.

So-called "coreless" leadframe technology facilitates using a leadframe as it is, that is without tape support.

Solutions currently referred to as MIS (Molded Interconnect Solutions) are exemplary of devices to which coreless leadframe technology may apply.

Essentially, MIS is a leadframe manufacturing technology similar to BGA laminate technology using a molding compound as the core.

Such a technology facilitates achieving fine inner lead tip pitch (50/60 micron, for instance) which is highly desirable for flip-chip applications.

It is noted that such arrangements may exhibit relatively low yield at manufacturing with costs of about 50-100% in excess of "standard" taped leadframes.

Additionally, certain conventional solutions may exhibit drawbacks related, for instance, to possible warpage (in the case of a metal carrier and a film mold, for instance).

In the case of MIS technology, notable leadframe warpage may be observed after assembly steps involving a thermal budget such as, for instance:

- die attachment with Die Attach Film (DAF): 100° C., few seconds;
- die attachment with glue/DAF curing 190° C., 1.5 hours;
- wire bonding (WB): 180-220° C., from few seconds to several minutes;
- (package) molding: 175° C., from 40 to 200 seconds; and
- Post Mold Curing: 175° C., from 4 to 12 hours.

BRIEF SUMMARY

The present disclosure provides one or more embodiments that overcome the drawbacks discussed in the foregoing.

According to one or more embodiments, such drawbacks can be overcome by resorting to a method having the features set forth in the claims that follow.

One or more embodiments may relate to a corresponding leadframe.

One or more embodiments may relate to a corresponding device (an integrated circuit, for instance).

The claims are an integral part of the technical disclosure of embodiments as provided herein.

One or more embodiments may offer one or more of the following advantages:

- simplified processing, which facilitates avoiding acts such as metal (copper) lamination, resist lamination, resist exposure, metal etching, resist stripping;
- possible implementation within an IC manufacturing plant (back end);
- reduced cycle time for prototypes; and
- reduced cost.

One or more embodiments may use laser direct structuring (LDS) technology in order to create vias and lines with the capability of replacing a metallic frame by metallization of vias and lines.

In at least one embodiment, a method of manufacturing leadframes for semiconductor devices is provided that includes: forming, by laser beam processing, a first pattern of electrically-conductive structures at a first surface of a laminar substrate; forming, by the laser beam processing, a second pattern of electrically-conductive structures at a second surface of the substrate, the second surface being opposite the first surface; and forming electrically-conductive vias through the substrate between the first surface of the substrate and the second surface of the substrate, the electrically-conductive vias coupled to at least one of the electrically-conductive structures in the first pattern of electrically-conductive structures and in the second pattern of electrically-conductive structures.

In at least one embodiment, a leadframe for semiconductor devices is provided that includes a laminar substrate of laser direct structuring material, the laminar substrate having first and second opposed surfaces. A first pattern of electrically-conductive structures is disposed at the first surface of the substrate, and the first pattern of electrically-conductive structures is formed by laser beam processing. A second pattern of electrically-conductive structures is disposed at the second surface of the substrate, and the second pattern of electrically-conductive structures is formed by laser beam processing. Electrically-conductive vias extend through the substrate between the first surface of the substrate and the second surface of the substrate, and the electrically-conductive vias are coupled to at least one of the electrically-conductive structures in the first pattern of electrically-conductive structures and in the second pattern of electrically-conductive structures.

In at least one embodiment, a semiconductor device is provided that includes a leadframe and at least one semiconductor chip or die attached to the leadframe. The leadframe includes: a laminar substrate of laser direct structuring material, the laminar substrate having first and second opposed surfaces; a first pattern of electrically-conductive structures at the first surface of the substrate, the first pattern of electrically-conductive structures formed by laser beam processing; a second pattern of electrically-conductive structures at the second surface of the substrate, the second pattern of electrically-conductive structures formed by laser beam processing; and electrically-conductive vias extending through the substrate between the first surface of the substrate and the second surface of the substrate, the electrically-conductive vias coupled to at least one of the electrically-conductive structures in the first pattern of electrically-conductive structures and in the second pattern of electrically-conductive structures. The at least one semiconductor chip or die is electrically coupled to the first pattern of electrically-conductive formations at the first surface of the substrate, the second pattern of electrically-conductive formations at the second surface of the substrate and the electrically-conductive vias.

BRIEF DESCRIPTION OF THE SEVERAL VIEWS OF THE DRAWINGS

One or more embodiments will now be described, by way of example only, with reference to the annexed figures, wherein.

Figures 1A, 1B, 1C, 1D:
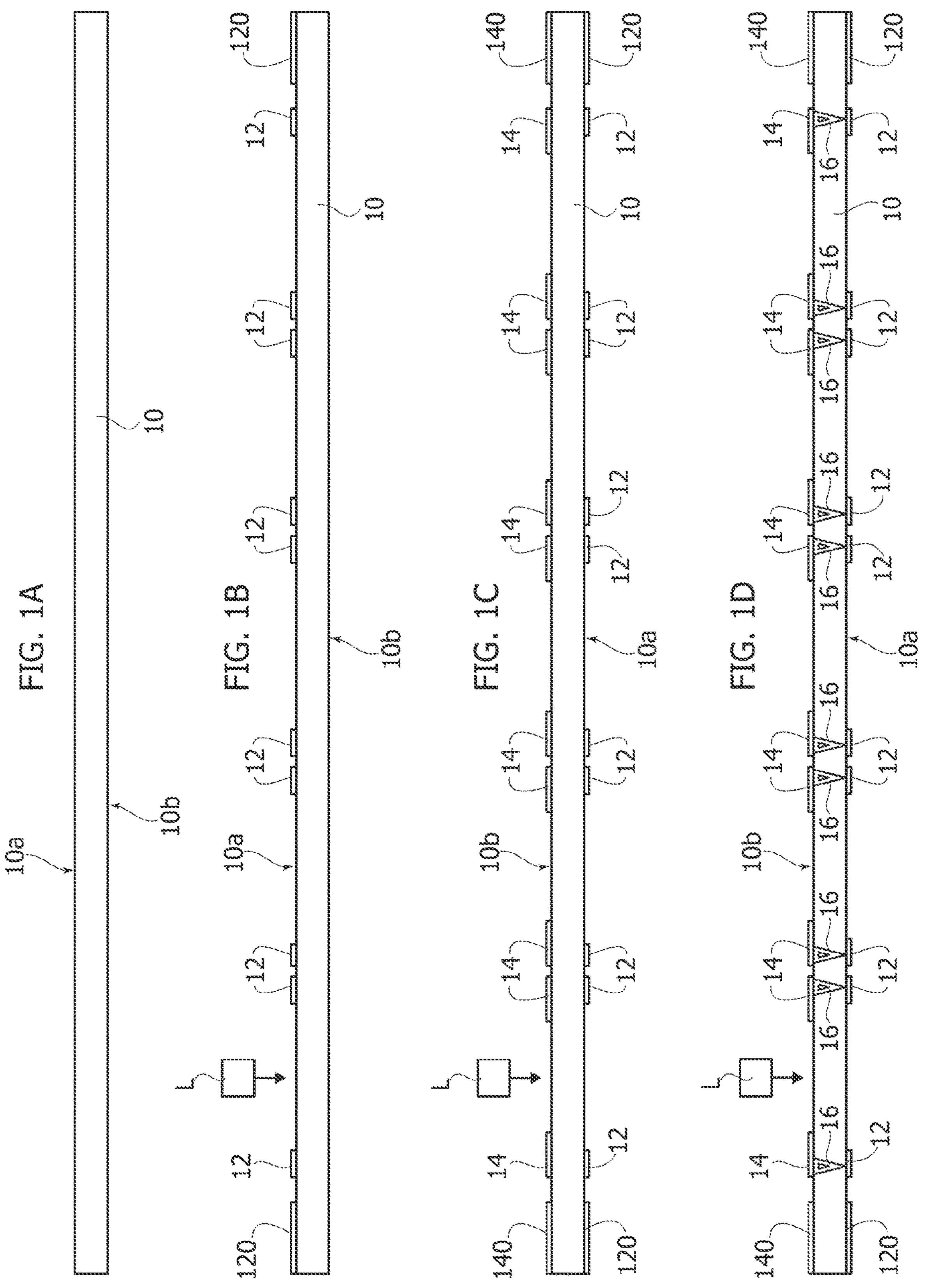
FIGS. 1A to 1G are cross-sectional diagrams illustrating a method of making or producing a leadframe in accordance with some embodiments.

It will be appreciated that, for the sake of clarity and ease of representation, the various figures may not be drawn to a same scale.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

The designation "leadframe" (or "lead frame") is currently used (see for instance the USPC Consolidated Glossary of the United States Patent and Trademark Office) to indicate a metal frame which provides support for an integrated circuit chip or die as well as electrical leads to interconnect the integrated circuit in the die or chip to other electrical components or contacts.

Laser Direct Structuring (LDS) is a laser-based machining technique now widely used in various sectors of the industrial and consumer electronics markets, for instance for high-performance antenna integration, where an antenna design can be directly formed onto a molded plastic part.

In an exemplary process, molded parts can be produced with commercially available resins which include additives suitable for the LDS process; a broad range of resins such as polymer resins like polycarbonate (PC), polycarbonate/acrylonitrile butadiene styrene (PC/ABS), acrylonitrile butadiene styrene (ABS), liquid-crystal polymer (LCP) are currently available for that purpose.

In LDS, a laser beam can be used to transfer a desired electrically-conductive pattern on the plastic molding, which is then subjected to metallization (for instance via electroless plating with copper or other metals) to finalize the desired conductive pattern.

One or more embodiments as exemplified herein involve the recognition that LDS facilitates providing electrically-conductive formations such as vias and lines in a molding compound, without further manufacturing steps and with a high flexibility in the shapes which can be obtained.

One or more embodiments can be applied to various types of semiconductor devices such as (by way of non-limiting examples) those semiconductor devices currently referred to as a QFN or QFN-mr, these being acronyms for Quad Flat Pack No-lead and Multirow Quad Flat Pack No-lead.

Such devices may include leadframes with so-called routed leads, namely electrically-conductive formations (leads) which from an outline location extend inwardly in the direction of a semiconductor chip or die.

One or more embodiments may facilitate achieving a reduced (fine) lead tip pitch at the inner (proximal) ends of the leads, that is the ends of the leads towards the semiconductor chip.

FIGS. 1A to 1G are cross-sectional diagrams illustrating a method of making or producing a leadframe (for instance for any one of the various types of semiconductor devices discussed in the foregoing) using LDS technology, in accordance with one or more embodiments.

FIG. 1A is exemplary of forming a substrate or layer 10 (a laminate core, for instance) of LDS material.

Any known LDS material (such as, for instance, a polymer resin like PC, PC/ABS, ABS, LCP including additives suitable for the LDS process) may be used advantageously in embodiments.

FIG. 1B is exemplary of an act of structuring the substrate 10 of FIG. 1A at the "bottom" or "back" surface thereof, designated 10*a*.

Such structuring may involve forming by LDS processing (that is, laser beam machining as schematically indicated at L) a first pattern of electrically-conductive structures or formations 12, 120.

FIG. 1C is exemplary of an act of structuring the substrate 10 of FIGS. 1A and 10B at the "top" or "front" surface thereof, designated 10*b*.

Such structuring (possibly, but not necessarily, performed after overturning the substrate 10) may involve forming, again by LDS processing (that is, laser beam machining L), a second pattern of electrically-conductive structures or formations 14, 140.

Those of skill in the art will appreciate that both the first pattern and the second pattern of electrically-conductive formations 12, 120 and 14, 140 can be provided according to any of a virtually boundless variety of possible patterns as desired, by also taking advantage of the intrinsic flexibility of LDS laser beam processing.

Figures 1E, 1F, 1G:
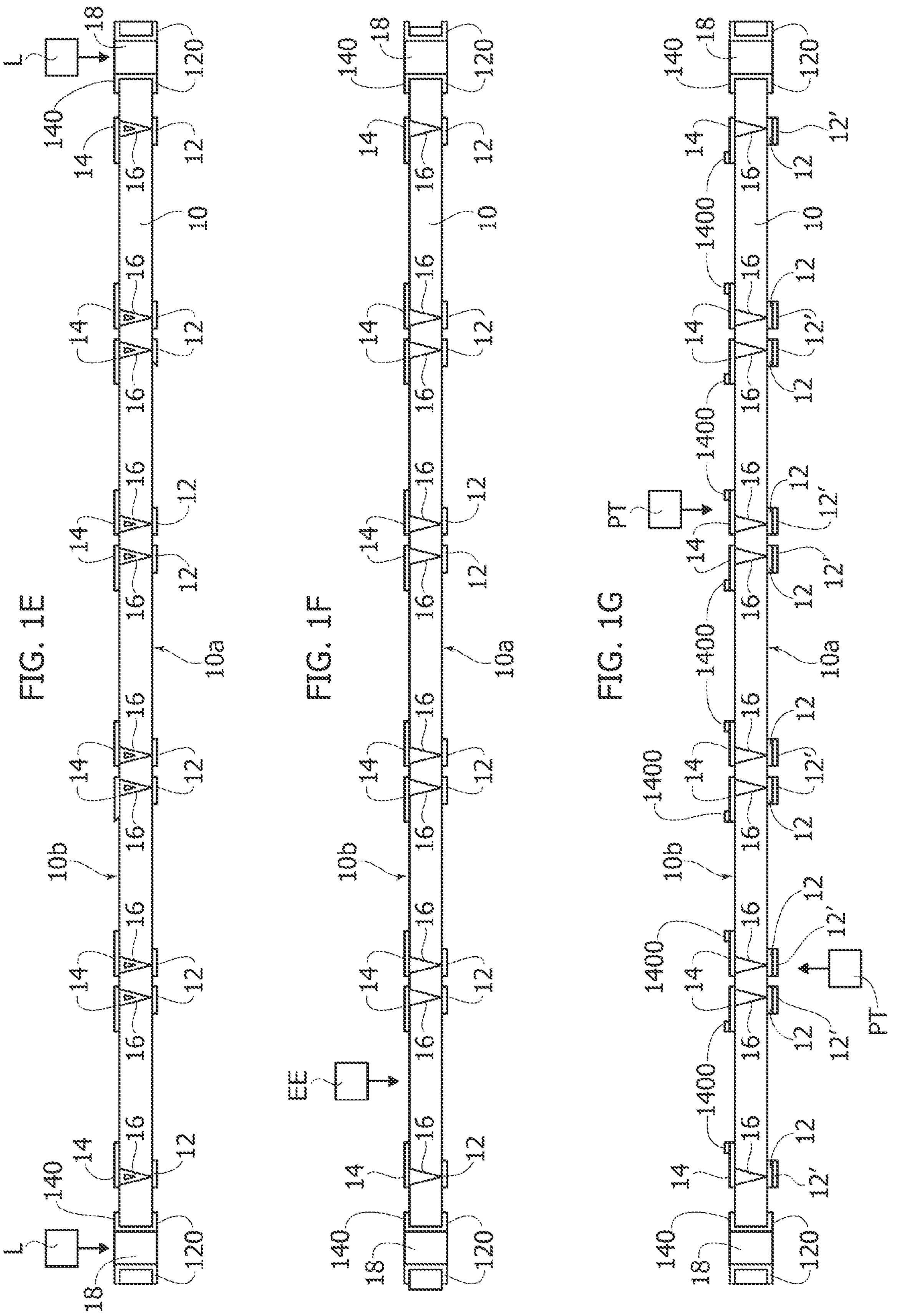
Figure 2:
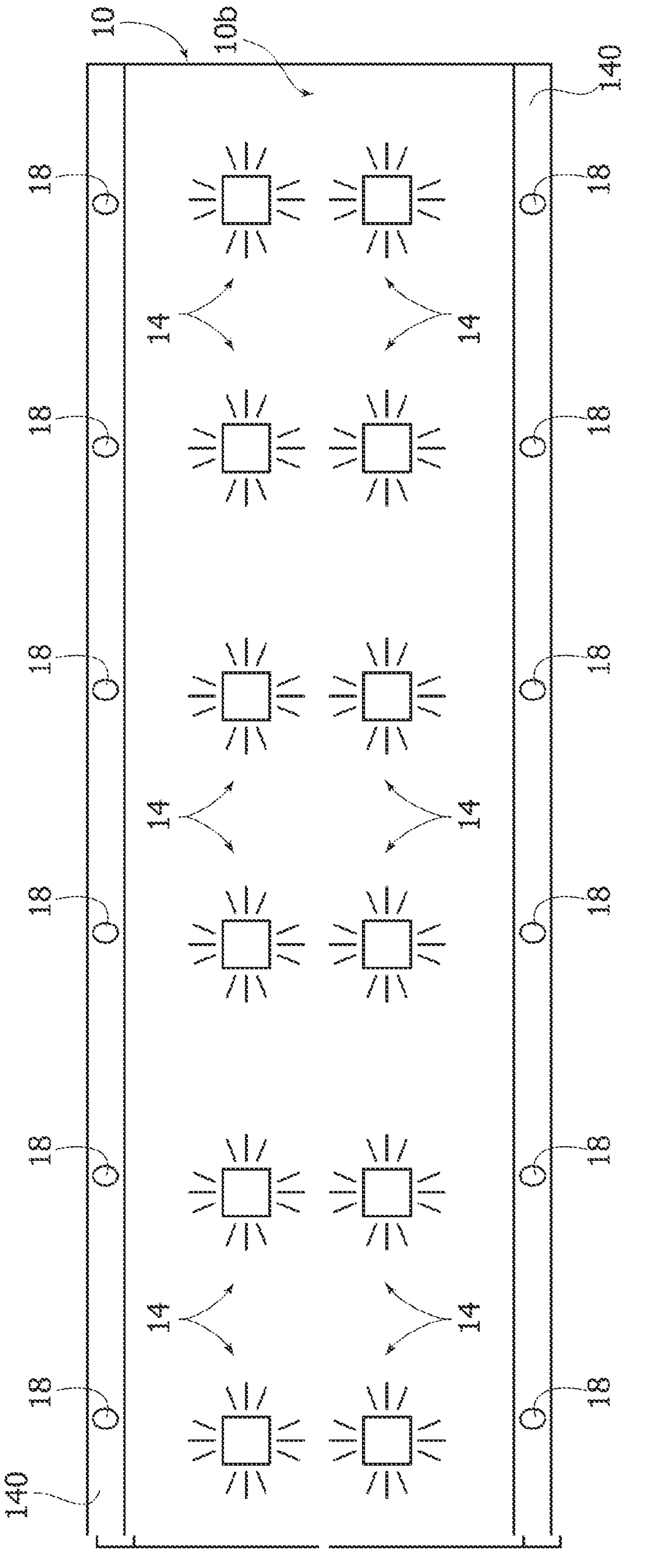
FIG. 2 is a plan view illustrating a leadframe in accordance with some embodiments.
Figure 3:
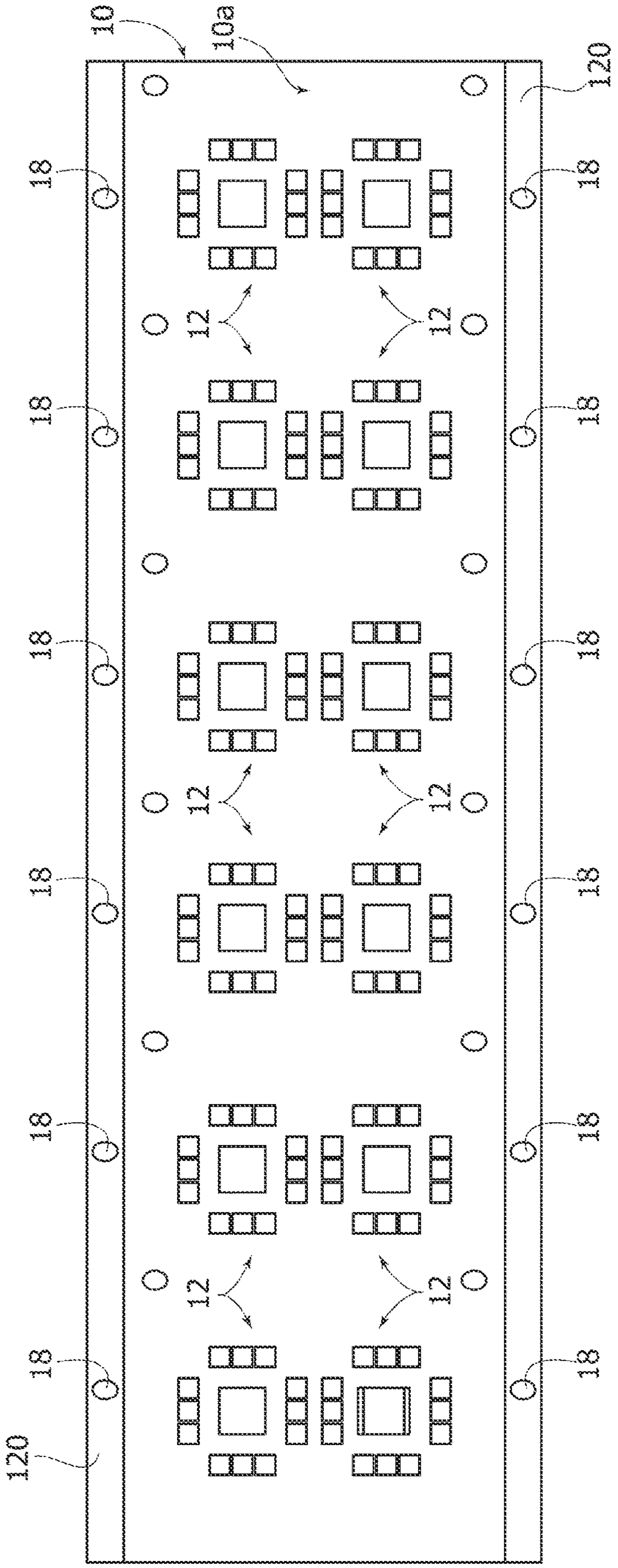
FIG. 3 is a plan view illustrating the leadframe of FIG. 2 from a viewpoint opposite the viewpoint of FIG. 2.

For instance, FIGS. 2 and 3 are exemplary of embodiments of performing the acts of FIG. 1A to 1F on strip-like material, virtually of indefinite length, to provide (simultaneously) a plurality of lead frames with longitudinal electrically-conductive formations 120, 140 extending along the sides of the strip-like material.

FIG. 1D is exemplary of laser processing (drilling by laser beam L) the substrate 10 having the front and back surfaces 10*a*, 10*b* structured as discussed previously to open vias 16 extending at desired locations between the electrically-conductive formations of the two patterns 12, 14 over the two surfaces 10*a*, 10*b*.

FIG. 1E is exemplary of similar processing (e.g., laser drilling) possibly applied to the structure of FIG. 1D in those embodiments where, as exemplified in FIGS. 2 and 3, the acts of FIGS. 1A to 1G are performed on strip-like material, to provide indexing holes 18 (essentially openings at a given pitch) in the longitudinal electrically-conductive formations 120, 140 or "rails" extending along the sides of the strip-like material.

FIG. 1F is exemplary of embodiments of growing conductive material (metal such as copper—Cu, for instance) onto the structured paths provided via laser processing of the LDS material as exemplified in FIGS. 1B to 1E.

Electroless/electrolytic growth as exemplified by EE in FIG. 1F may be used for that purpose, that is in order to improve (via growth of copper, for instance) the conductivity of the traces/holes formed in the LDS material by laser processing.

Electroless processing (optionally preceding electrolytic processing) may facilitate a thicker metal growth.

Also, in those embodiments where a high (Cu, for instance) metal growth is not a desired feature, electroless alone (that is without electrolytic plating) can be used.

It is noted that the conductive formations (traces, for instance) formed with laser processing of LDS material may have a thickness, and thus a conductivity, insufficient for certain applications, such as power devices, for instance: indeed few microns of LDS material may be ablated in the laser activation process (and possibly more in the case of drilling), with the treated material possibly having activated particles (chromium, for instance) at its surface.

Also, while exemplified in relief in the figures for simplicity and ease of understanding, the laser-treated surface portions of the LDS material may not be in relief, but rather recessed.

Those of skill in the art will thus appreciate that passing from an "intermediate" structure obtained (solely) via laser activation to a resulting final structure may involve such a step as exemplified in FIG. 1F, that is forming, e.g., electroplated conductive formations.

FIG. 1G is exemplary of an (optional) plating act PT which may be applied with otherwise conventional means in order to provide plated conductive formations over the leads at the bottom side 10*a* and/or over the lead tips at the top side 10*b*: see, for instance 12' (material complying with surface mount soldering, for instance) and 1400 (these may be pads or bumps for wire/ribbon bonding or the like) in FIG. 1G.

Figures from 1A to 1G are thus exemplary of a manufacturing sequence of an exemplary leadframe including acts of: strip molding (FIG. 1A), bottom laser structuring (FIG. 1B), top laser structuring (FIG. 1C), vias generation connecting the two top/bottom layers (FIG. 1D), opening of indexing holes (or any other feature as desired) on top/bottom rails (FIG. 1E), forming conductive material onto the traces, holes, and so on obtained by laser structuring (FIG. 1F), top/bottom layer metallization (FIG. 1G).

For instance, in an act as exemplified in FIG. 1F, all traces, holes obtained by laser structuring (see FIGS. 1B to 1E, for example) may be electroless plated—for less than 10 micron thickness, for instance—or electroplated—up to 50 microns thickness—in case of high current devices, for instance.

FIGS. 2 and 3 are exemplary of a device or structure resulting from the method illustrated in FIGS. 1A to 1G in a plan view from the top or front side 10*b* (FIG. 2) and from the bottom or back surface 10*a* (FIG. 3).

As discussed, FIGS. 2 and 3 are exemplary of a device or structure resulting from performance of the method of FIG. 1A to 1F on strip-like material, virtually of indefinite length, to provide a plurality of lead frames to be finally "singulated" (before or after die attachment).

Such an act of singulation may be facilitated by using the indexing holes 18 in the longitudinal electrically-conductive formations 120, 140 or "rails".

Indeed, such leadframe rails 120, 140 may contain features (such as holes 18) which facilitate leadframe indexing and/or unit location into assembly equipment. They can also contain identification codes (2D Codes) and "fiducials" (such as crosses, L shapes, or the like) which facilitates properly locating the path of the sawing blade during package singulation.

Figure 4A:
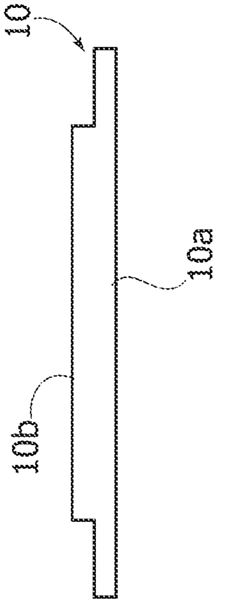
FIGS. 4A and 4B are cross-sectional diagrams illustrating possible types of substrates which may be utilized in accordance with some embodiments.
Figure 4B:
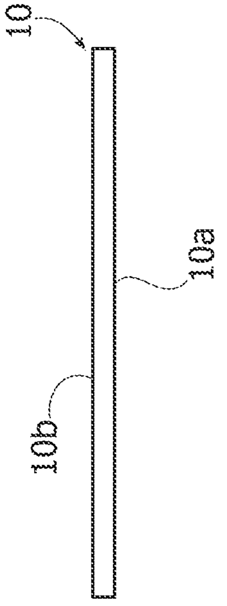

FIGS. 4A and 4B are exemplary of applying processing as discussed in connection with the previous figures both to "mono-thickness" substrates 10 and to "dual-thickness" or "multiple-thickness" substrates, for instance having a mesa-like cross sectional profile with a central portion upstanding in comparison with the longitudinal sides of the strip-like structure exemplified in FIGS. 2 and 3. One or more embodiments as exemplified herein may thus apply to device structure based on a copper dual layer or multiple layers.

Figure 5:
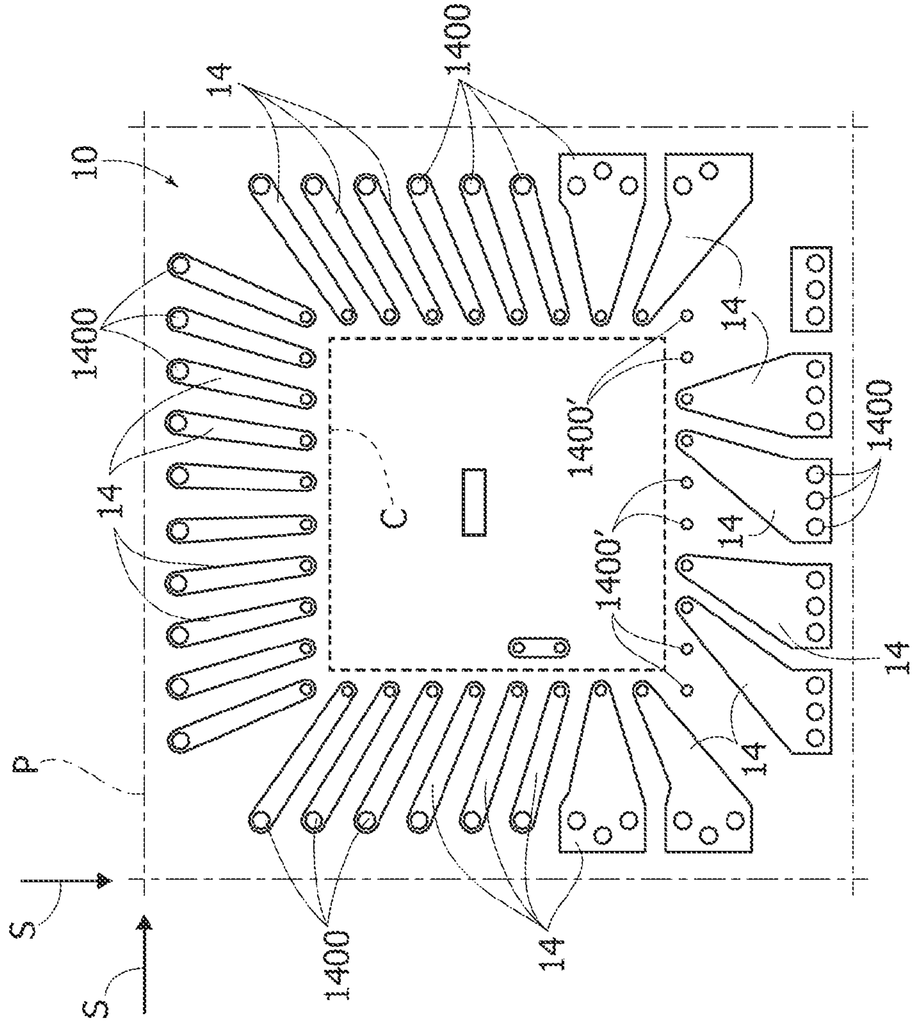
FIG. 5 is plan view illustrating a leadframe in accordance with some embodiments.

FIG. 5 is exemplary of a leadframe adapted to be produced as exemplified herein.

A single leadframe is exemplified for simplicity showing the presence of a (central) die-mounting area at the top or front surface 10*b* where a semiconductor die or chip can be attached (by any technique known for that purpose to those of skill in the art as discussed by way of example in the introductory portion of the description) as indicated in dashed lines at C.

As exemplified in FIG. 5, the pattern of electrically-conductive formations 14 may provide an array of routing leads suited to provide electrical coupling of the semiconductor die or chip with contact pads accessible from outside a device package. A possible outline of such a package (which may be provided by any technique known for that purpose to those of skill in the art, for instance by molding an epoxy molding compound) is indicated by P in FIG. 5.

Electrical coupling of the semiconductor die or chip may be via conventional techniques such as wire bonding, stud bumps or the like.

Whatever the option(s) adopted for that purpose, such coupling may take advantage of the provision of contact formations as indicated by 1400 in FIG. 5.

FIG. 5 also exemplifies the possible presence of contact lands or bumps as indicated by 1400' which do not come down to any electrically-conductive formations 14 at the top or front surface 10*b* but rather correspond to vias 16 formed through the substrate 10 coming down to electrically-conductive formations 12 at the bottom or back surface 10*a*.

One or more embodiments as exemplified herein thus adopt laser direct structuring (LDS) processing in order to create electrically-conductive formations such as vias and lines of various types with metallization of vias and lines adapted to replace a metallic frame.

FIG. 5 is exemplary of a "real-world" example providing a leadframe including an array of leads extending between a die-mounting region for mounting a semiconductor chip or die C and the periphery of a substrate 10 of an LDS material. As exemplified in FIG. 5, one or more of these leads may have a generally flared shape with a narrow "proximal" tip facing the die mounting area C and a width (and thus area/cross-sectional area) gradually increasing in a "distal" direction away from the die mounting area towards for periphery of the substrate 10.

As noted, final singulation of a lead frame (as exemplified by arrows S in FIG. 5) may take place with the die or chip C already attached thereon, possibly with die or chip already electrically coupled and packaged as discussed previously.

One or more embodiments facilitate providing a device structure with or without plated conductive formations (die pads, for instance) on both sides of the leadframe.

One or more embodiments may adopt LDS structuring in order to create electrically-conductive formations such as vias and lines with metallization of vias and lines adapted to replace a metallic frame such as conventional leadframes.

A method of manufacturing leadframes for semiconductor devices as exemplified herein may comprise:

providing a laminar substrate (for instance, 10) of laser direct structuring material, the laminar substrate comprising first (for instance, bottom or back surface 10*a*) and second (for instance, top or front surface 10*b*) opposed surfaces; and applying laser beam processing (for instance, L) to said substrate to provide a first pattern of electrically-conductive formations (for instance, 12, 120) at the first surface of said substrate, a second pattern of electrically-conductive formations (for instance, 14, 140) at the second surface of said substrate, and electrically-conductive vias (for instance, 16) through said substrate between the first surface of said substrate (10) and the second surface of said substrate, the electrically-conductive vias coupled to at least one (that is, to both of 12, 14, see, for instance 12, 14 in FIGS. 1D to 1G or even just one, see, for instance and 1400' in FIG. 5, where 1400' are coupled only to 12 on the bottom of back side) of the electrically-conductive formations in said first pattern of electrically-conductive formations and said second pattern of electrically-conductive formations.

A method as exemplified herein may comprise applying laser beam processing to said substrate to provide electrically-conductive vias coupled to at least one of the electrically-conductive formations in said first pattern of electrically-conductive formations and at least one of the electrically-conductive formations in said second pattern of electrically-conductive formations (see, for instance 16 in FIGS. 1D to 1G).

A method as exemplified herein may comprise forming (see EE in FIG. 1F, for instance) electrically-conductive material onto said first pattern of electrically-conductive formations, said second pattern of electrically-conductive formations and said electrically-conductive vias provided by applying laser beam processing to said substrate.

In a method as exemplified herein, said forming electrically-conductive material may comprise electroless and/or electrolytic growth (for instance, electroless plus electrolytic) of electrically-conductive material, such as metal like copper.

A method as exemplified herein may comprise forming plated contact formations (see, for instance P; 12', 1400 in FIG. 1G) over said first pattern of electrically-conductive formations and/or said second pattern of electrically-conductive formations (optionally, as exemplified in FIG. 1G, this may occur "on top" of, that is onto, the electrically-conductive material formed as exemplified in FIG. 1F).

A method as exemplified herein may comprise:

providing a strip-like laminar substrate (see, for instance, FIGS. 2 and 3) of laser direct structuring material and applying laser beam processing to said strip-like laminar substrate to provide a plurality of assemblies each including a first pattern of electrically-conductive formations at the first surface of said substrate, a second pattern of electrically-conductive formations at the second surface of said substrate, and electrically-conductive vias through said substrate between the first surface of said substrate and the second surface of said substrate, the electrically-conductive vias coupled to at least one (see 12, 14 in FIGS. 1D to 1F and 1400' in FIG. 5, where 1400' are coupled only to 12 on the bottom of back side) of the electrically-conductive formations in said first pattern of electrically-conductive formations and said second pattern of electrically-conductive formations; and applying singulation (for instance, S in FIG. 5) to said strip-like laminar substrate after application of laser beam processing, said singulation to separate the assemblies in said plurality of assemblies.

A method as exemplified herein may comprise providing, optionally by laser beam drilling of said strip-like laminar substrate, indexing apertures (for instance, 18) sidewise of said strip-like laminar substrate, said indexing apertures providing reference markers in applying singulation to said strip-like laminar substrate.

A leadframe for semiconductor devices as exemplified herein may comprise:

a laminar substrate of laser direct structuring material, the laminar substrate comprising first and second opposed surfaces; and portions (for instance, 12, 120, 14, 140, 16) of said substrate subjected to laser beam processing as exemplified herein.

A leadframe for semiconductor devices as exemplified herein may comprise electrically-conductive material, optionally metal such as copper, formed onto said portions of said substrate subjected to laser beam processing.

A leadframe for semiconductor devices as exemplified herein may comprise plated contact formations over said first pattern of electrically-conductive formations and/or said second pattern of electrically-conductive formations (optionally, as exemplified in FIG. 1G, these plated contact formations may be provided "on top" of, that is onto, the electrically-conductive material formed onto the portions of the substrate subjected to laser beam processing as exemplified in FIG. 1F).

In a leadframe for semiconductor devices as exemplified herein, at least one of said first and second pattern of electrically-conductive formations may comprise an array of electrically-conductive formations between a die-mounting area (for instance, C) of said substrate and the periphery of said substrate.

In a leadframe for semiconductor devices as exemplified herein, said array of electrically-conductive formations may comprise electrically-conductive formations having an increasing width away from said die-mounting area and towards the periphery of said substrate.

A semiconductor device as exemplified herein may comprise:

one (or more) leadframe(s) as exemplified herein; and one (or more) semiconductor chip(s) or die/dice (for instance, C) attached to said leadframe, the at least one semiconductor chip or die electrically coupled to electrically-conductive formations out of said first pattern of electrically-conductive formations at the first surface of said substrate, said second pattern of electrically-conductive formations at the second surface of said substrate and said electrically-conductive vias.

Without prejudice to the underlying principles, the details and embodiments may vary, even significantly, with respect to what has been described by way of example only, without departing from the extent of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A leadframe for semiconductor devices, the leadframe comprising:

- a laminar substrate of laser direct structuring material, the laminar substrate having first and second opposed surfaces;
- a first pattern of electrically-conductive structures at the first surface of the substrate, the first pattern of electrically-conductive structures formed by laser beam processing;
- a second pattern of electrically-conductive structures at the second surface of the substrate, the second pattern of electrically-conductive structures formed by laser beam processing; and
- electrically-conductive vias extending through the substrate between the first surface of the substrate and the second surface of the substrate, the electrically-conductive vias coupled to at least one of the electrically-conductive structures in the first pattern of electrically-conductive structures and in the second pattern of electrically-conductive structures.

2. The leadframe of claim 1, comprising an electrically-conductive material on the first pattern of electrically-conductive structures, the second pattern of electrically-conductive structures, and the electrically-conductive vias.

3. The leadframe of claim 2 wherein the electrically-conductive material includes copper.

4. The leadframe of claim 1, comprising plated contact formations over at least one of the first pattern of electrically-conductive structures or the second pattern of electrically-conductive structures.

5. The leadframe of claim 1, wherein at least one of the first or second patterns of electrically-conductive structures includes an array of electrically-conductive structures between a die-mounting area of the substrate and a periphery of the substrate.

6. The leadframe of claim 5, wherein the array of electrically-conductive structures includes electrically-conductive structures having an increasing width away from the die-mounting area of the substrate and towards the periphery of the substrate.

7. The leadframe of claim 1, wherein at least one of the first pattern of electrically-conductive structures and the second pattern of electrically-conductive structures, each formed by the laser beam processing, comprises routed leads having a reduced lead tip pitch relative to electrically-conductive structures that are not formed by the laser beam processing.

8. A semiconductor device, comprising:

- a leadframe, including:
  - a laminar substrate of laser direct structuring material, the laminar substrate having first and second opposed surfaces;
  - a first pattern of electrically-conductive structures at the first surface of the substrate, the first pattern of electrically-conductive structures formed by laser beam processing;
  - a second pattern of electrically-conductive structures at the second surface of the substrate, the second pattern of electrically-conductive structures formed by laser beam processing; and
  - electrically-conductive vias extending through the substrate between the first surface of the substrate and the second surface of the substrate, the electrically-conductive vias coupled to at least one of the electrically-conductive structures in the first pattern of electrically-conductive structures and in the second pattern of electrically-conductive structures; and
- at least one semiconductor chip or die attached to the leadframe, the at least one semiconductor chip or die electrically coupled to the first pattern of electrically-conductive structures at the first surface of the substrate, the second pattern of electrically-conductive structures at the second surface of the substrate and the electrically-conductive vias.

9. The semiconductor device of claim 8, comprising an electrically-conductive material on the first pattern of electrically-conductive structures, the second pattern of electrically-conductive structures, and the electrically-conductive vias.

10. The semiconductor device of claim 9, wherein the electrically-conductive material includes copper.

11. The semiconductor device of claim 8, comprising plated contact formations over at least one of the first pattern of electrically-conductive structures or the second pattern of electrically-conductive structures.

12. The semiconductor device of claim 8, wherein at least one of the first or second patterns of electrically-conductive structures includes an array of electrically-conductive structures between a die-mounting area of the substrate and a periphery of the substrate.

13. The semiconductor device of claim 12, wherein the array of electrically-conductive structures includes electrically-conductive structures having an increasing width away from the die-mounting area of the substrate and towards the periphery of the substrate.

14. The semiconductor device of claim 8, wherein at least one of the first pattern of electrically-conductive structures and the second pattern of electrically-conductive structures, each formed by the laser beam processing, comprises routed leads having a reduced lead tip pitch relative to electrically-conductive structures that are not formed by the laser beam processing.

15. A device, comprising:

- a substrate;
- a first pattern of laser direct structuring electrically-conductive structures on a first side of the substrate;
- a second pattern of laser direct structuring electrically-conductive structures on a second side of the substrate;
- a plurality of vias coupled between the first and second patterns of electrically-conductive structures.

16. The device of claim 15 wherein the substrate is a laminate core.

17. The device of claim 15 wherein the substrate is a laser direct structuring material.

18. The device of claim 15 wherein the first pattern is a first plurality of contact pads around a die pad area.

19. The device of claim 18 wherein the second pattern is a second plurality of contact pads that corresponds and is aligned with the first plurality of contact pads.

20. The device of claim 15, wherein at least one of the first pattern of laser direct structuring electrically-conductive structures and the second pattern of laser direct structuring electrically-conductive structures, each formed by laser beam processing, comprises routed leads having a reduced lead tip pitch relative to electrically-conductive structures that are not formed by the laser beam processing.

* * * * *